United States Patent
Brintzinger et al.

(10) Patent No.: US 7,390,742 B2
(45) Date of Patent: Jun. 24, 2008

(54) METHOD FOR PRODUCING A REWIRING PRINTED CIRCUIT BOARD

(75) Inventors: Axel Brintzinger, Dresden (DE); Stefan Ruckmich, Dresden (DE); Octavio Trovarelli, Dresden (DE); Ingo Uhlendorf, deceased, late of Stade (DE); by Fritz Uhlendorf, legal representative, Stade (DE); David Wallis, Dresden (DE)

(73) Assignee: Infineon Technologies AG, Munich (DE)

( * ) Notice: Subject to any disclaimer, the term of this patent is extended or adjusted under 35 U.S.C. 154(b) by 97 days.

(21) Appl. No.: 11/251,594

(22) Filed: Oct. 14, 2005

(65) Prior Publication Data

US 2006/0121257 A1 Jun. 8, 2006

(30) Foreign Application Priority Data

Oct. 16, 2004 (DE) .................. 10 2004 050 476

(51) Int. Cl.
 *H01L 21/44* (2006.01)
(52) U.S. Cl. .................. 438/678; 257/758; 257/683; 257/723; 257/E23.002; 257/E23.114; 257/E23.194; 438/107; 438/110; 438/108; 438/109; 438/976
(58) Field of Classification Search .............. 438/106, 438/107, 612, 613, 614, 618, 622, 110, 108, 438/109, 623, 654, 976; 257/678, 683, 723, 257/758, E23.002, E23.114, E23.194
See application file for complete search history.

(56) References Cited

U.S. PATENT DOCUMENTS

| 5,529,950 | A | 6/1996 | Hoenlein et al. |
| 6,379,781 | B1 | 4/2002 | Suzuki et al. |
| 6,881,662 | B2* | 4/2005 | Kung et al. .................. 438/629 |
| 2003/0080400 | A1* | 5/2003 | Okamoto et al. ............ 257/678 |
| 2003/0127742 | A1 | 7/2003 | Sankman |
| 2004/0171190 | A1* | 9/2004 | Nishitani et al. ............ 438/106 |
| 2004/0226745 | A1* | 11/2004 | En .............................. 174/262 |

OTHER PUBLICATIONS

German Examination Report dated Aug. 1, 2005.

* cited by examiner

*Primary Examiner*—W. David Coleman
*Assistant Examiner*—Su C Kim
(74) *Attorney, Agent, or Firm*—Patterson & Sheridan, L.L.P.

(57) ABSTRACT

The invention relates to a method for producing a rewiring printed circuit board with a substrate wafer having passage connections between a first and a second surface. One embodiment of the method comprises applying and patterning masking layers on the first and the second surfaces, thereby uncovering a first contact location on the first surface and a second contact location on the second surface; applying a protective layer to the second surface in order to protect the corresponding masking layer and the second contact location during subsequent method steps; applying a first conductor structure to the first surface, the first conductor structure on the first surface covering the first contact location; removing the protective layer on the second surface; and applying a second conductor structure to the second surface, the second conductor structure on the second surface covering the second contact location.

21 Claims, 6 Drawing Sheets

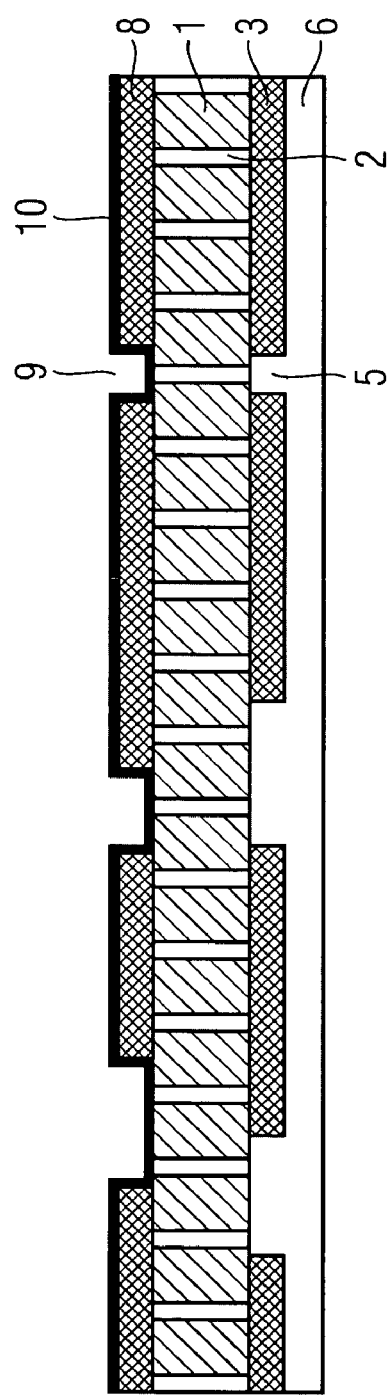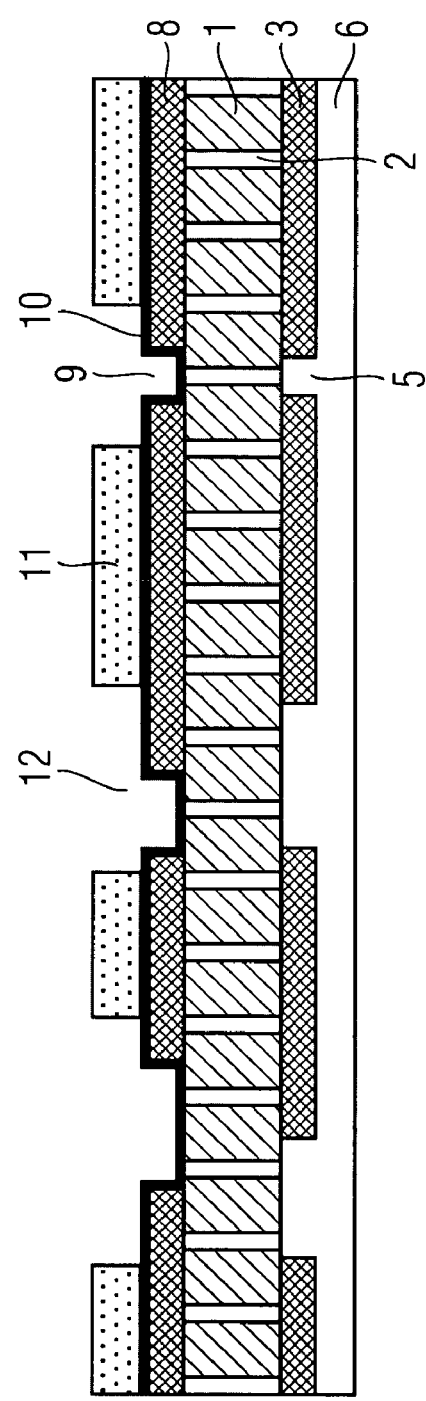

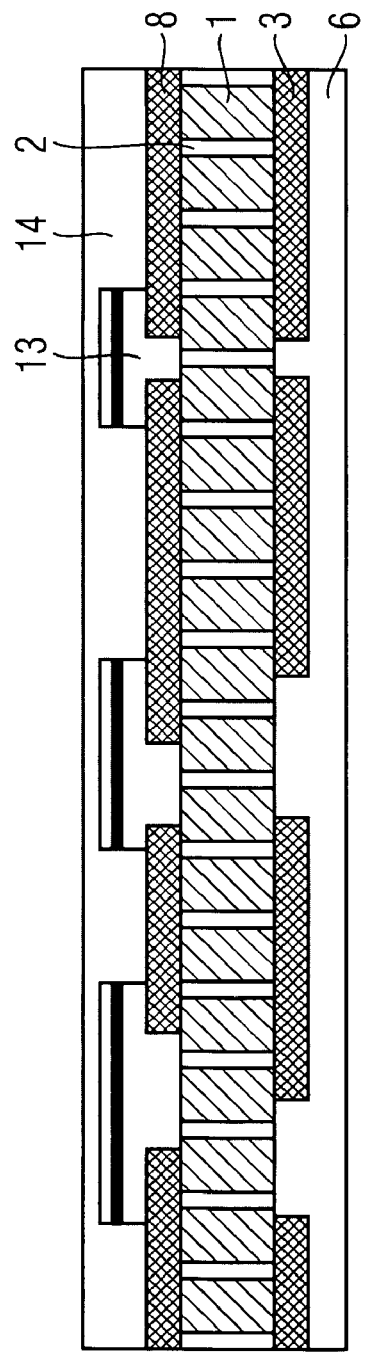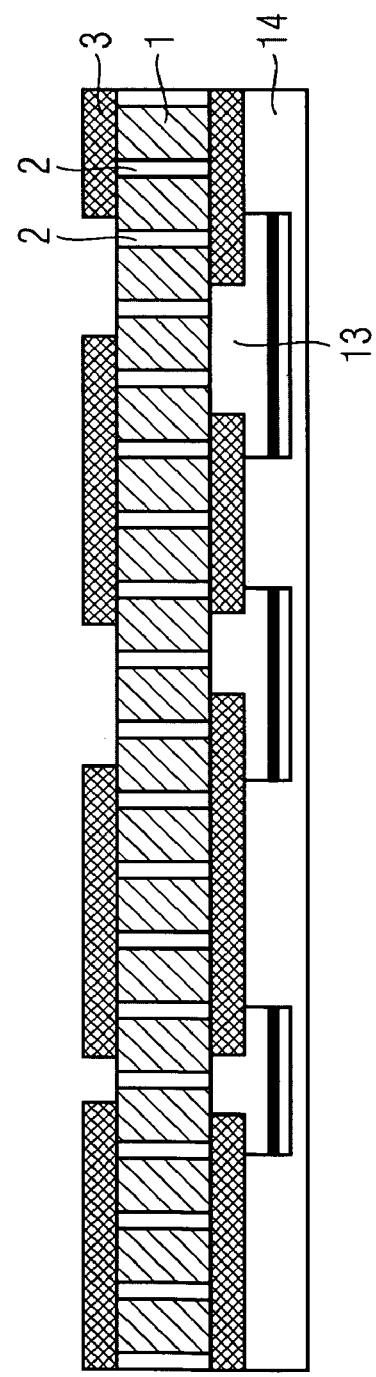

ated patent application is herein incorporated by reference in its entirety.

METHOD FOR PRODUCING A REWIRING PRINTED CIRCUIT BOARD

CROSS-REFERENCE TO RELATED APPLICATIONS

This application claims foreign priority benefits under 35 U.S.C. §119 to co-pending German patent application number DE 10 2004 050 476.8-33, filed 16 Oct. 2004. This related patent application is herein incorporated by reference in its entirety.

BACKGROUND OF THE INVENTION

1. Field of the Invention

The invention relates to a method for producing a rewiring printed circuit board with the aid of an anisotropically conductive substrate wafer. In particular, the method relates to a method for producing a rewiring printed circuit board with a silicon substrate wafer having plated-through holes in a regular arrangement.

2. Description of the Related Art

The further processing of integrated circuits into a housing, and also the construction of stacked arrangements of integrated circuits require so called rewiring printed circuit boards which ensure that the external terminals of the housing or of the stacked arrangement are connected to the individual pads of the integrated circuits.

The previous methods for producing such rewiring printed circuit boards have in the meantime encountered technological limits, since the rewiring conductor tracks (conductive lines) are patterned using a printed circuit board technology whose resolution limit has been reached.

Furthermore, when the rewiring printed circuit board is connected to the integrated circuits, which are usually fabricated in a silicon substrate, thermal stresses occur during operation, since rewiring printed circuit board and integrated circuit often have different coefficients of thermal expansion. For this reason, rewiring printed circuit boards having plated-through holes are already being fabricated from silicon material, and in which case passage connections can be formed by the plated-through holes through uncovered regions lying opposite one another on the substrate surfaces.

One problem in the production of such rewiring printed circuit boards consists, however, in the fact that hitherto the conventional technologies for processing silicon substrates have had to be combined with technologies for the application of conductor tracks by electro-deposition in the production of such rewiring printed circuit boards.

The simultaneous processing of the front and rear sides of a substrate wafer as proposed, e.g., in the document U.S. Pat. No. 6,379,781 B1 likewise cannot be carried out in a suitable manner by methods of silicon technology. In particular, the processes of producing the masking layer for defining the positions for the plated-through holes of the substrate wafer and the methods for patterning and applying the conductor tracks adversely affect one another on account of process parameters such as, for example, temperature, pressure, materials used, so that, according to the order of the method steps, either one of the masking layers on one of the surfaces of the substrate wafer or the conductor tracks on one of the surfaces of the substrate wafer are impaired by a subsequent process.

SUMMARY OF THE INVENTION

Therefore, the object set is that of providing a method for producing a rewiring printed circuit board in which the results of the individual method steps for producing the masking layer for defining the positions for the plated-through holes and for producing the conductor tracks (conductive lines) do not significantly impair one another.

The invention provides a method for producing a rewiring printed circuit board with an anisotropically conductive substrate wafer having passage connections between a first and a second surface. The method comprises the steps of applying and patterning masking layers on the first and the second surface of the substrate wafer, thereby uncovering a first contact location on the first surface and a second contact location on the second surface, of applying a protective layer to the second surface in order to protect the corresponding masking layer and the second contact location during subsequent method steps, of applying a first conductor structure to the first surface of the substrate wafer, the first conductor structure on the first surface covering the first contact location, of removing the protective layer on the second surface, and of applying a second conductor structure to the second surface of the substrate wafer, the second conductor structure on the second surface covering the second contact location.

The method according to the invention has the advantage that it can be used to produce a rewiring printed circuit board with the aid of an anisotropically conductive substrate wafer. During the production method, the previously applied masking layer that is initially not being processed can be covered and protected by the protective layer, so that it is possible to produce, with the aid of further subsequent method steps, the masking layer on the surface on which the conductor tracks are then intended to be produced. In this case, the protective layer protects the masking layer that has already been applied on the second surface against influences of the production processes for the conductor tracks. Conversely, by virtue of the fact that the masking layers are produced on the first and second surfaces prior to the application of the conductor tracks, the conductor tracks that have already been applied on the first surface are protected against the processes required for applying and patterning the masking layer.

In accordance with a further embodiment of the present invention, the method comprises the further step of applying a further protective layer to the first surface as soon as the conductor structures have been formed on the first surface, so that during the subsequent processing of the second conductor structures on the second surface, these conductor structures are protected.

It may be provided that the application of the masking layers to the first and the second surface of the substrate wafer is carried out by means of one of the method steps of vapor deposition, dip coating, vapor phase deposition.

The patterning of the masking layer is preferably carried out by means of a lithography and etching process, in particular with the aid of a lithography and etching process such as is used in silicon technology.

The protective layer may be formed in diverse ways, for example by means of coating methods such as dip coating, spray coating and rotational coating, or by applying a plastic film that is adhesively bonded or laminated onto the respective surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A to 1L show the method states after the individual method steps of the method according to one embodiment of the invention for producing a rewiring printed circuit board.

DETAILED DESCRIPTION OF THE PREFERRED EMBODIMENT

Figure 1A:
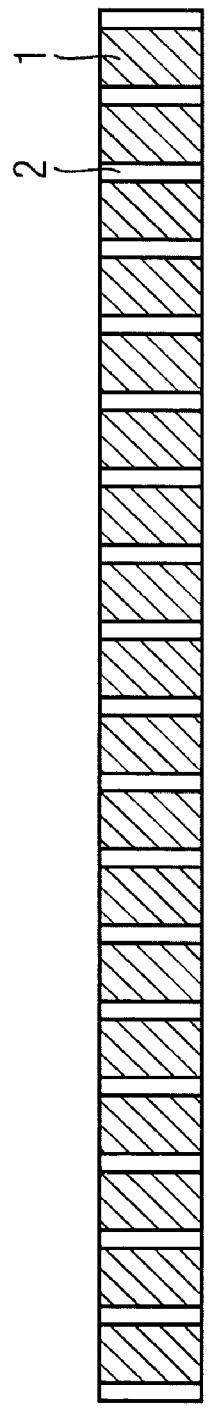

In accordance with FIG. 1A, provision is made of a substrate wafer 1 with plated-through holes 2 that are arranged substantially regularly. The substrate wafer 1 is preferably a silicon substrate wafer into which, using methods already known, plated-through holes have been introduced by means of etching steps and the like, which plated-through holes have been filled with a conductive material. The silicon substrate wafer is preferably provided with a low doping in order to achieve a low conductivity in the transverse direction between the plated-through holes 2. By way of example, the plated-through holes 2 are produced by a procedure in which, in successive process steps, the surface of the silicon substrate is masked with a masking layer and passage holes are introduced into the silicon substrate during a selective depth etching into the silicon substrate. The passage holes are subsequently filled with a suitable conductive material. In this case, the surface of the silicon substrate is masked in such a way that the passage connections 2 are produced in a regular arrangement.

Instead of a silicon substrate, it is also possible to use substrate wafers made of other materials, which are preferably nonconductive or exhibit only little conductivity and can be patterned in a suitable manner with the aid of process steps known from silicon technology. It is generally possible to use a broad range of nonconductive materials as substrate, such as ceramic, for example, since conductor structures with very small dimensions can be applied thereon using known techniques.

Anisotropic etching methods, that is to say etching methods with preferred etching directions (controlled directional etching), are taken into consideration as etching methods for producing the plated-through holes. Thus, by way of example, it is possible to use reactive ion etching (RIE), reactive ion beam etching (RIBE) or anisotropic wet etching in the case of a crystalline silicon substrate. The aspect ratio of the passage holes (depth of a passage hole in relation to the diameter thereof) should preferably be 10:1, in order to achieve a sufficient density of the passage holes arranged on the substrate wafer without the passage holes touching one another. The density of the passage holes is preferably more than 100 per mm2.

Although the conductivity of the undoped or lightly doped silicon substrate is low, it is possible, in order to further reduce the transverse conductivity, that is to say e.g. the conductivity between two adjacent passage holes, for the inner surface of the passage holes to be passivated, or provided with a passivation layer, before the conductive material is introduced into the passage holes. This results in better insulation between the conductive material and the substrate of the substrate wafer. The passivation layer is preferably provided as an oxide or nitride layer that is deposited thermally or with the aid of a CVD method (chemical vapor deposition) on the inner surfaces of the passage holes.

Figure 1B:
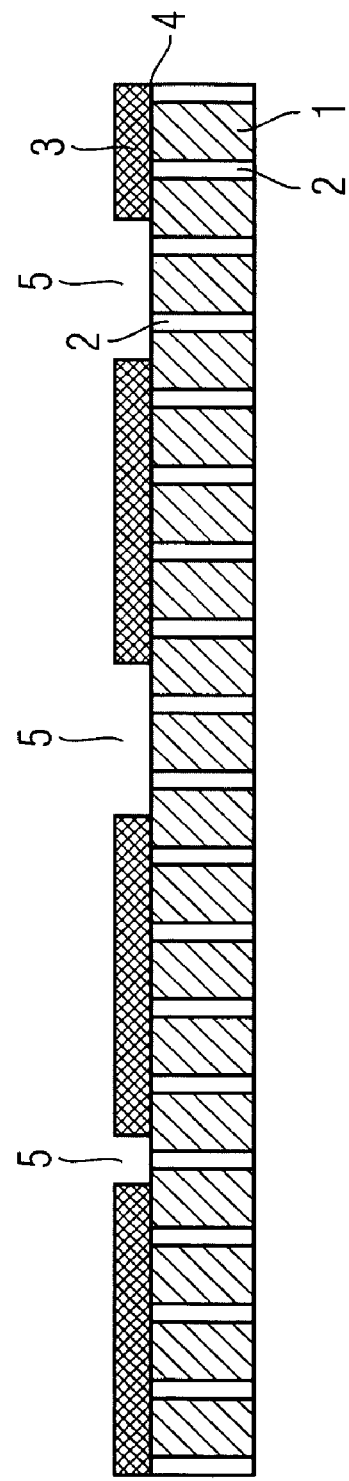

FIG. 1B illustrates the method state after the application of a first masking layer 3 on a first surface 4 of the substrate wafer 1. The first masking layer 3 is formed as a dielectric layer in order to cover the plated-through holes 2, thereby forming a suitable insulation that insulates the plated-through holes from a conductor track that is subsequently to be applied. The first masking layer 3 is subsequently patterned with the aid of lithography and etching technology in order to create first contact locations 5 at which the plated-through holes 2 are uncovered. The first masking layer 3 is patterned by application of a photoresist, subsequent exposure and development of the photoresist, and an etching process in which the underlying masking layer 3 is etched through windows in the photoresist uncovered as a result of the development. Depending on the material of the applied first masking layer 3, the latter is cured after patterning, in order to ensure a sufficient connection between the substrate wafer 1 and the patterned first masking layer 3.

Figure 1C:
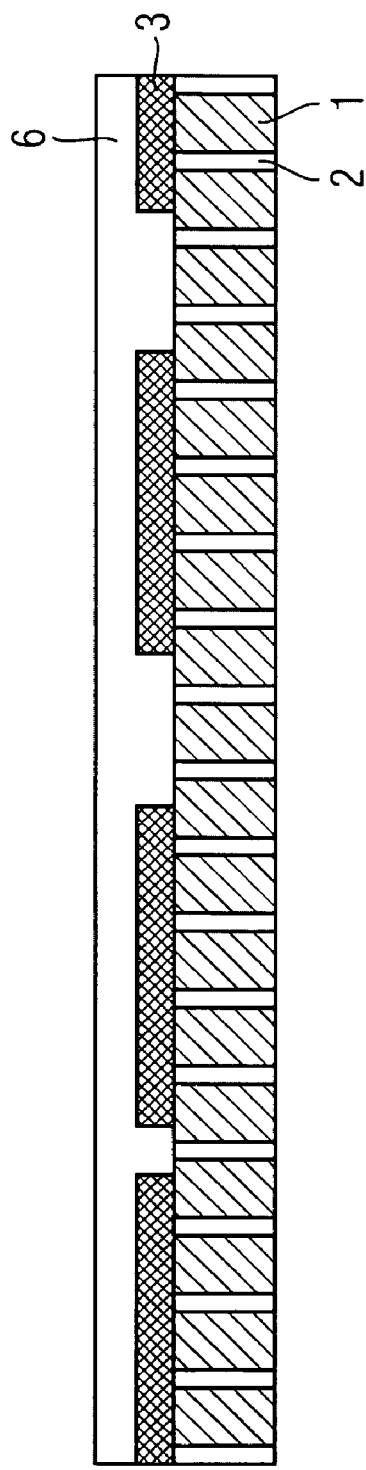

In accordance with the method state of FIG. 1C, a protective layer 6 is subsequently applied to the patterned first masking layer 3, which protective layer protects the first surface 4 of the substrate wafer 1 including the first masking layer 3 applied thereon. The protective layer 6 may be applied by means of a coating method, such as dip coating, rotational coating or spray coating, for coating with a suitable material, such as an epoxy resin, for example. As an alternative it is possible for the protective layer to be adhesively bonded on or laminated on in the form of a film in order to protect the first surface of the substrate wafer 1.

Figure 1D:
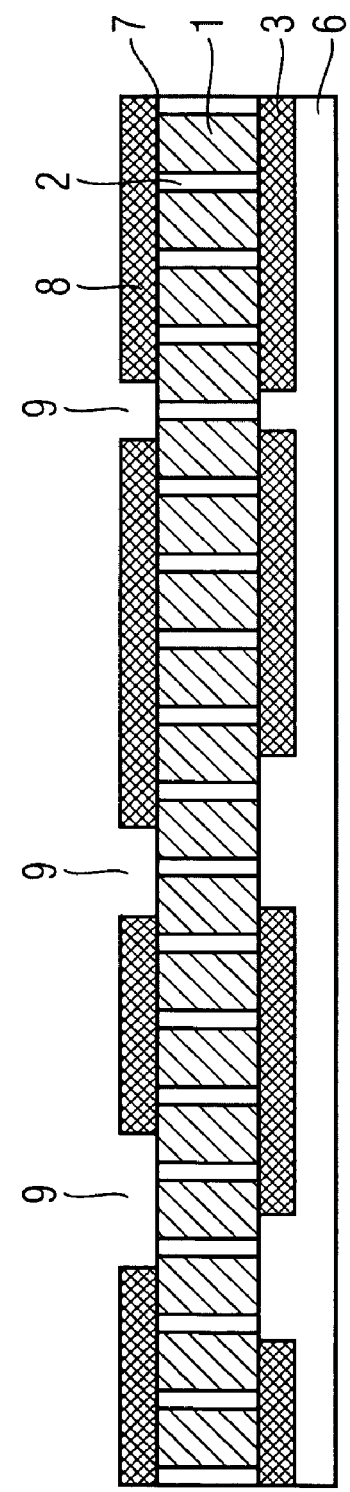

As is illustrated in the method state of FIG. 1D, the substrate wafer 1 is then processed on a second surface 7. The second surface 7 is coated with a second masking layer 8. The second masking layer 8 is subsequently patterned in order to uncover second contact locations 9. The second contact locations 9 preferably lie opposite the first contact locations 5 at least partly, the first and second contact locations 5, 9 being connected to one another by plated-through holes 2. The way in which the second masking layer 8 is produced essentially does not differ from the production of the first masking layer 3. By virtue of the fact that the first masking layer 3 is covered by the protective layer 6, this is not impaired by the application of the second masking layer 8. Thus, the protective layer 6 protects the first masking layer 3 not only against the influences of the individual process steps, but also against mechanical influences that may be caused for example by the substrate wafer 1 being placed onto a carrier.

FIG. 1E shows the method state after the application of a seed layer 10 to the second surface 7 of the substrate wafer and to the second masking layer 8, respectively. The seed layer 10 is preferably applied autocatalytically with the aid of a sputtering method or some other suitable method. The seed layer 10 has the materials titanium and copper, for example, firstly a titanium layer being deposited on the second substrate surface 7 and a copper layer being deposited onto the titanium layer, the titanium layer serving as a diffusion barrier that prevents copper ions from diffusing into the substrate wafer 1 and making the latter conductive, which would give rise to an undesirable transverse conductivity. The thickness of the titanium layer is preferably 50 nm and the thickness of the copper layer of the seed layer is 175 nm.

Afterward, as illustrated in FIG. 1F, the seed layer 10 is covered with the aid of a further masking layer 11, which is then patterned, so that the conductor track locations 12, that is to say the locations at which the conductor track is subsequently intended to be applied, are uncovered again in such a way that the seed layer 10 is uncovered there. The further masking layer 11 remains at the rest of the locations.

Figure 1G:
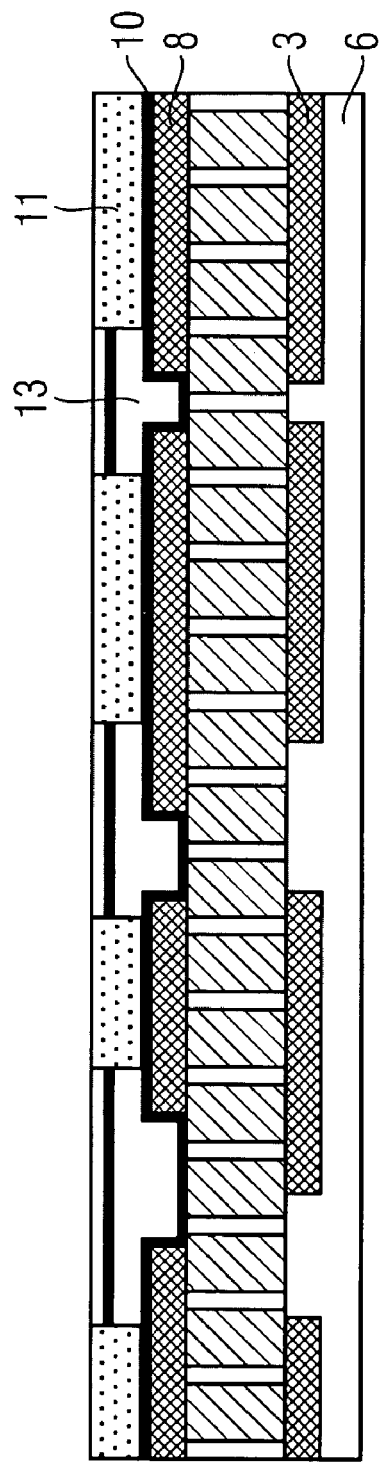

Afterward, as is shown in FIG. 1G, the conductor tracks are deposited on the uncovered seed layer 10 with the aid of an electrodeposition method. The conductor tracks 13 are preferably deposited in a three-layer construction, copper, nickel and gold successively being applied to the seed layer 10 by electrodeposition.

Figure 1H:
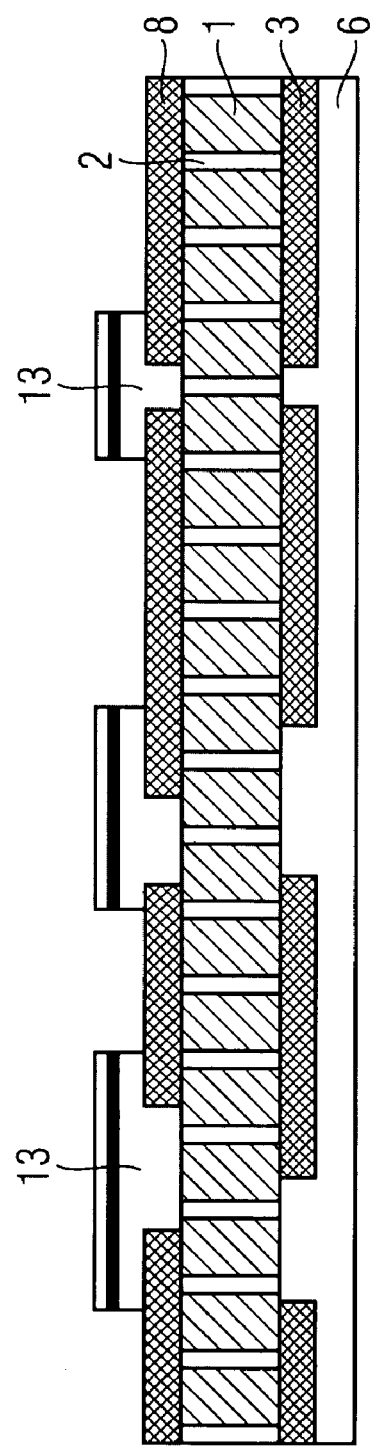

As is shown in FIG. 1H, after the application of the conductor tracks 13, the further masking layer 11 and the seed layer 10 situated underneath are removed again to leave the conductor tracks 13, which are insulated from one another by clearances. In this way, the second surface 7 has been provided with conductor tracks which, as is illustrated in the method state according to FIG. 1I, are covered with a further protective layer 14 in order to protect them from subsequent method steps. The further protective layer 14 may have the same materials and be produced in the same way as the protective layer 6. In particular, an adhesively bonded-on film is suitable as a protective layer since this has sufficient robustness during the processing of the opposite surface substrate wafer.

Figure 1K:
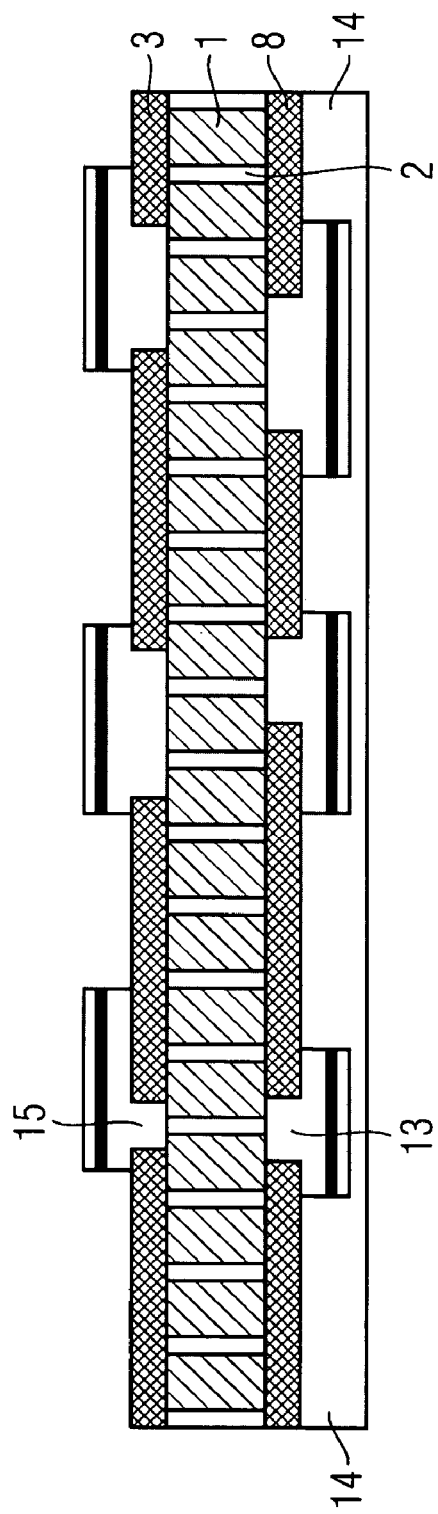
Figure 1L:
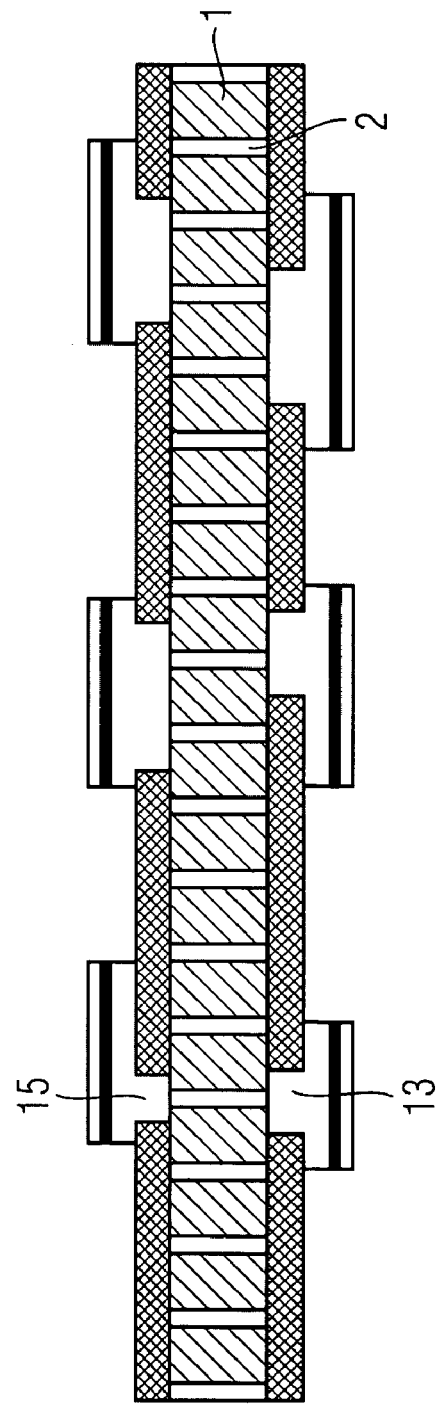

As is shown in FIG. 1J, the substrate wafer 1 is then arranged in a manner for processing the first surface 4. The protective layer 6 is previously removed again on the first surface 4, so that the masking layer 3 is uncovered. As indicated in FIG. 1k, conductor tracks are then also applied on the first surface of the substrate wafer 1, which is carried out with the aid of the steps described in FIGS. 1e to 1h. After the completion of the first conductor tracks 14 on the first surface of the substrate wafer 1, the further protective layer 14 can be removed, with the result that the rewiring printed circuit board illustrated in FIG. 1L is obtained. The rewiring printed circuit board has conductor tracks 13, 14 on both sides, which are electrically connected to one another at contact positions 5, 9 defined beforehand with the aid of the masking layers 3, 8.

While the foregoing is directed to embodiments of the present invention, other and further embodiments of the invention may be devised without departing from the basic scope thereof, and the scope thereof is determined by the claims that follow.

What is claimed is:

1. A method for producing a rewiring printed circuit board with a substrate having conductive passage connections between opposing first and second surfaces of the substrate, the method comprising:
   applying a first masking layer on the first surface;
   applying a second masking layer on the second surface;
   patterning the first and second masking layers to uncover a first contact location pattern on the first surface and a second contact location pattern on the second surface, respectively; and
   applying a first protective layer to the first surface in order to protect the first masking layer and the first contact location pattern during a subsequent process, wherein applying the first protective layer occurs prior to applying the second masking layer; the subsequent process comprising:
      forming a first conductor structure on the second surface, the first conductor structure covering the second contact location pattern;
      removing the first protective layer from the first surface; and
      subsequently forming a second conductor structure on the first surface, the second conductor structure covering the first contact location pattern.

2. The method of claim 1, further comprising applying a second protective layer to the second surface and the first conductor structure prior to forming the second conductor structure.

3. The method of claim 1, wherein upon forming the first and second conductor structures, the first and second conductor structures are conductively coupled via one or more of the conductive passage connections.

4. The method of claim 1, wherein the first and second conductor structures are at least partially overlapping each other and are conductively coupled via one or more of the conductive passage connections.

5. The method of claim 1, wherein applying the first and second masking layers comprises at least one of vapor deposition, dip coating, and vapor phase deposition.

6. The method of claim 1, wherein patterning the masking layers comprises a lithography process and an etching process.

7. The method of claim 1, wherein applying at least one of the first and second protective layers comprises at least one of dip coating, spray coating, rotational coating.

8. The method of claim 1, wherein applying at least one of the first and the second protective layers comprises one of adhesively bonding a plastic film and laminating a plastic film onto the respective surface.

9. The method of claim 1, wherein the substrate is fabricated from a silicon substrate.

10. A method for producing a rewiring printed circuit board with a substrate having conductive passage connections between opposing first and second surfaces of the substrate, the method comprising:
    applying a first masking layer on the first surface;
    patterning the first masking layer to uncover a first contact location pattern on the first surface; and
    applying a first protective layer to the first surface in order to protect the first masking layer and the first contact location pattern during a first subsequent process; the first subsequent process comprising:
       applying a second masking layer on the second surface;
       patterning the second masking layer to uncover a second contact location pattern on the second surface;
       subsequently forming a first conductor structure on the second surface, the first conductor structure covering the second contact location pattern;
       removing the first protective layer from the first surface; and
       applying a second protective layer to the second surface in order to protect the first conductor structure during a second subsequent process; the second subsequent process comprising forming a second conductor structure on the first surface, the second conductor structure covering the first contact location pattern.

11. The method of claim 10, wherein the first and second conductor structures comprise conductive lines.

12. The method of claim 10, wherein the first and second conductor structures are at least partially overlapping each other and are conductively coupled via one or more of the conductive passage connections.

13. The method of claim 10, wherein applying the first and second masking layers comprises at least one of vapor deposition, dip coating, and vapor phase deposition.

14. The method of claim 10, wherein patterning the masking layers comprises a lithography process and an etching process.

15. The method of claim 10, wherein applying at least one of the first and second protective layers comprises at least one of dip coating, spray coating, and rotational coating.

16. The method of claim 10, wherein applying at least one of the first and the second protective layers comprises one of adhesively bonding a plastic film and laminating a plastic film onto the respective surface.

17. The method of claim 10, wherein the substrate is fabricated from a silicon substrate.

18. A rewiring printed circuit board with a substrate comprising conductive passage connections between opposing first and second surfaces of the substrate and further comprising a first conductor structure formed on the second surface and a second conductor structure formed on the first surface, wherein portions of the first and second conductor structures are conductively coupled via the conductive passage connections, the rewiring printed circuit board having been fabricated according to a fabrication process, comprising:
  applying a first masking layer on the first surface;
  applying a second masking layer on the second surface;
  patterning the first and second masking layers to uncover a first contact location pattern on the first surface and a second contact location pattern on the second surface, respectively; and
  applying a first protective layer to the first surface in order to protect the first masking layer and the first contact location pattern during a subsequent process, wherein applying the first protective layer occurs prior to applying the second masking layer; the subsequent process comprising:
    forming the first conductor structure on the second surface, the first conductor structure covering the second contact location pattern;
    removing the first protective layer from the first surface; and
    subsequently forming the second conductor structure on the first surface, the second conductor structure covering the first contact location pattern.

19. The rewiring printed circuit board of claim 18, wherein the first and second conductor structures comprise conductive lines.

20. The rewiring printed circuit board of claim 18, the fabrication process further comprising applying a second protective layer to the second surface and the first conductor structure prior to forming the second conductor structure.

21. The rewiring printed circuit board of claim 18, the fabrication process further comprising applying a second protective layer to the second surface and the first conductor structure prior to forming the second conductor structure.

* * * * *